(12) United States Patent
Ma et al.

(10) Patent No.: US 11,531,397 B2
(45) Date of Patent: *Dec. 20, 2022

(54) HAPTIC FEEDBACK SYSTEM HAVING TWO INDEPENDENT ACTUATORS

(71) Applicant: Microsoft Technology Licensing, LLC, Redmond, WA (US)

(72) Inventors: Siyuan Ma, Bothell, WA (US); James David Holbery, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 35 days.

This patent is subject to a terminal disclaimer.

(21) Appl. No.: 17/150,046

(22) Filed: Jan. 15, 2021

(65) Prior Publication Data

US 2021/0132697 A1    May 6, 2021

Related U.S. Application Data

(63) Continuation of application No. 16/155,450, filed on Oct. 9, 2018, now Pat. No. 10,901,510.

(51) Int. Cl.
*G06F 3/01*      (2006.01)
*H01L 41/08*     (2006.01)

(52) U.S. Cl.
CPC .............. *G06F 3/016* (2013.01); *G06F 3/014* (2013.01); *H01L 41/0825* (2013.01)

(58) Field of Classification Search
CPC ....... G06F 3/016; G06F 3/014; H01L 41/0825
USPC ....................................... 340/407.1
See application file for complete search history.

(56) References Cited

U.S. PATENT DOCUMENTS

| 10,901,510 | B2* | 1/2021 | Ma ........................... B25J 15/12 |
| 2008/0266273 | A1* | 10/2008 | Slobodin ............... G06F 3/0446 |
| | | | 345/173 |
| 2014/0139328 | A1* | 5/2014 | Zellers .................... G06F 3/041 |
| | | | 340/407.2 |
| 2018/0275810 | A1* | 9/2018 | Khoshkava ........... G06F 3/0488 |

* cited by examiner

*Primary Examiner* — Kerri L McNally
(74) *Attorney, Agent, or Firm* — Alleman Hall Creasman & Tuttle LLP

(57) ABSTRACT

An electronic device comprises a haptic feedback system. The haptic feedback system includes a first haptic actuator coupled to a controller via a first set of two or more electrodes, and a second haptic actuator coupled to the first haptic actuator, and further coupled to the controller via a second set of two or more electrodes. The controller is configured to provide a first drive signal to the first haptic actuator via the first set of two or more electrodes, and to provide a second drive signal, different from the first drive signal, to the second haptic actuator via the second set of two or more electrodes. Combining two haptic actuators allows for a broader range of feedback and a heightened user experience.

17 Claims, 6 Drawing Sheets

HAPTIC FEEDBACK SYSTEM HAVING TWO INDEPENDENT ACTUATORS

CROSS REFERENCE TO RELATED APPLICATIONS

This application is a continuation of U.S. patent application Ser. No. 16/155,450, filed Oct. 9, 2018, the entirety of which is hereby incorporated herein by reference for all purposes.

BACKGROUND

Various devices may be utilized to provide haptic feedback for a computing device. For example, a portable device may provide haptic feedback in the form of vibration when worn or carried by a user.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

One example provides an electronic device comprising a haptic feedback system. The haptic feedback system includes a first haptic actuator coupled to a controller via a first set of two or more electrodes, and a second haptic actuator coupled to the first haptic actuator, and further coupled to the controller via a second set of two or more electrodes. The controller is configured to provide a first drive signal to the first haptic actuator via the first set of two or more electrodes, and to provide a second drive signal, different from the first drive signal, to the second haptic actuator via the second set of two or more electrodes.

DETAILED DESCRIPTION

Figure 1:
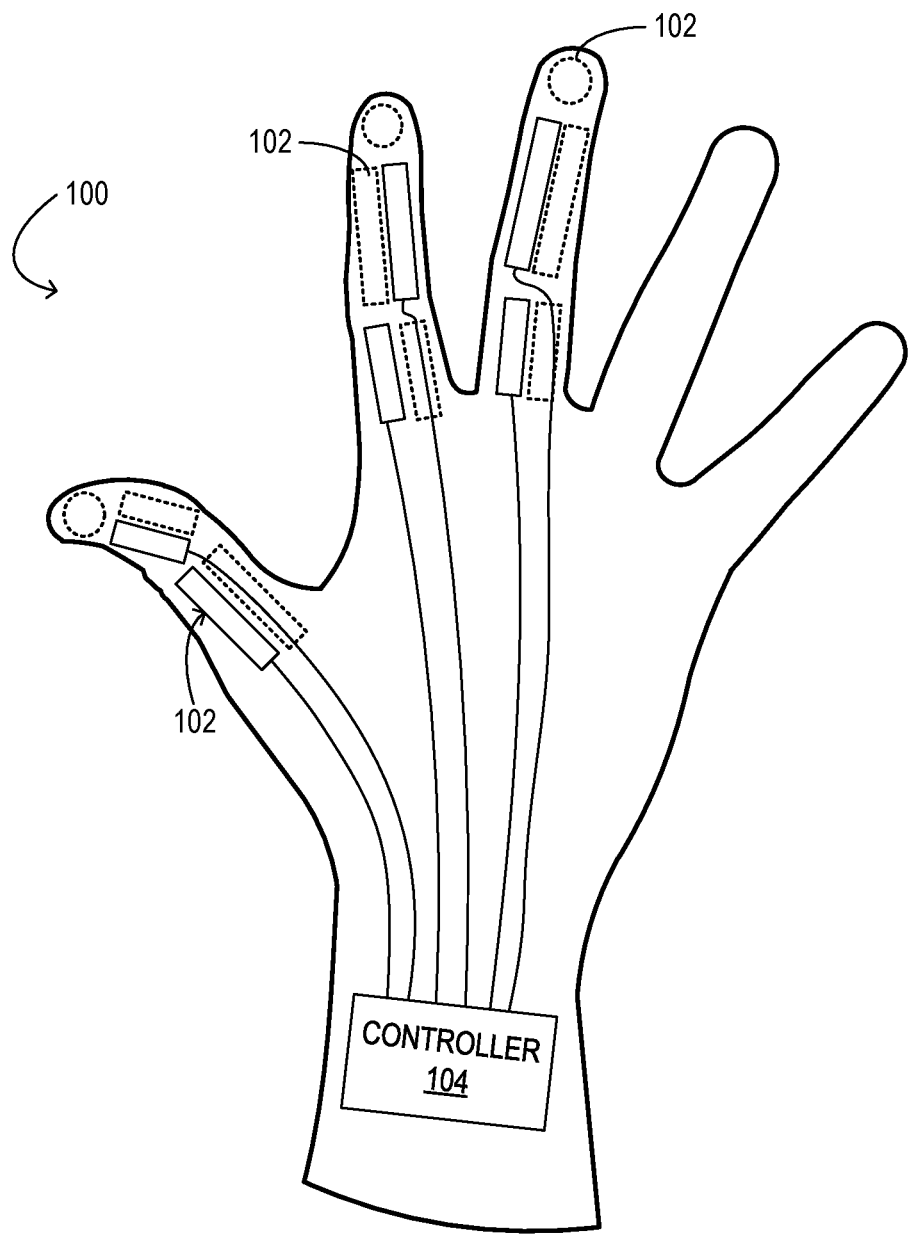
FIG. 1 shows an example wearable device in the form of a glove configured to provide haptic feedback.

The development of artificial haptics faces the challenge of accurately conveying perception to a user. This may include artificial stimuli, artificial sensory feedback, artificial sensation, etc. By using a single haptic actuator, the user experience is limited by the properties of the actuator. For example, piezo-electric polymers, such as polyvinylidene fluoride (PVDF) can provide a wide-band of actuation, but may be limited in actuation output force. Conversely, piezo-electric ceramics, such as lead zirconate titanate (PZT), can generate a strong actuation force, but may not be well-suited for subtle information delivery due to the nature of its mechanical rigidity. Linear resonant actuators (LRA) may have fast response times, but may be limited by a narrow band of actuation frequencies. Eccentric rotating mass vibration motors (ERM) are DC controlled, and thus mainly suitable for continuous output applications. Further, ERMs may have limited long-term durability due to a susceptibility to wear. Voice coil haptic actuators are generally bulky, and thus not well-suited for wearable applications.

This challenge may be exemplified in various fields. For example, virtual reality (VR) and artificial reality (AR) applications may provide wearable devices that offer the user tactile feedback, haptics, proprioception, etc. in order to generate a more immersive environment. Also, soft robotics applications may be tasked with automating the handling and grasping of soft or fragile objects. Both applications may involve the application of delicate forces via actuation and also receiving feedback as to what is the object being grasped and how hard the object is being grasped. VR and AR applications further may involve providing textural simulation to the user to generate the sensation of grasping a virtual object, while soft robotics may involve identifying small intricate features on a surface to identify and dictate how much force can safely be applied to an object.

Accordingly, examples are disclosed of piezo-electric polymers and piezo-electric ceramics combined into a single device, thereby saving valuable space and delivering a variety of experiences within a single electronic package. This may provide for actuation within a wide output frequency band (e.g., 10 to 500 Hz), and be tunable to two separate frequency ranges that are independent of each other. For wearable devices, softness may be maintained against a user's skin via a piezo-electric polymer stack while providing the requisite compliance to address a variety of unique haptic experiences and to enhance simulated touch and sensation. For soft robotics applications, the combined device may allow feedback at the point of contact to modulate the force applied to an object, thereby allowing more sensitive and reactive grasping methods. In addition to wearable and soft robotic devices, numerous other platforms may benefit from the ability to deliver multiple haptic experiences, such as hand-held, computing, industrial, medical, and automotive, to more closely replicate the multitude of receptors that resides within the human touch experience. Such multiple tactile haptic interfaces may be incorporated into automotive controllers, flight controllers, drone controllers, marine controllers, surgical controllers, gaming controllers, and other user interfaces.

FIG. 1 schematically shows an example wearable device 100 that includes sensors and actuators. Wearable device 100 takes the form of a glove comprising a plurality of combined haptic actuators 102 and controller 104. In other examples, a wearable device may take the form of a sleeve worn around an arm, a leg, and/or another body part, a sock, a headband, etc. Combined haptic actuators 102 are shown positioned in locations corresponding to fingertips and joints of the thumb, forefinger, and middle finger, but may be positioned at any suitable locations, (e.g., knuckles) in other examples. As described in more detail with regard to FIG. 2, each combined haptic actuator 102 may have a user-adjacent side (e.g., proximal to and/or interfacing with the user's skin) and a user-distal side, opposite the user-adjacent side. In some examples, wearable device 100 may include additional sensors (e.g., flex sensors, pressure sensors, touch sensors, inertial measurement sensors) and/or actuators (e.g. motion-restricting devices such as electrostatic clutches).

Controller 104 may be configured to control the application of voltages to combined haptic actuators 102. Application of voltages may be performed via controller 104 in response to signals received by the various sensors of wearable device 100. As described in more detail below with regard to FIGS. 2 and 3, combined haptic actuators 102 may both provide a signal to controller 104 and receive a signal from controller 104. The signals provided by controller 104 may be based at least in part on the signals received from combined haptic actuators 102 and/or signals received from other sensors of wearable device 100.

In some examples, wearable device 100 may be communicatively coupled to one or more computing devices, such as a head-mounted display system configured to present an augmented or virtual reality environment to a user. Wearable device 100 may be configured to further augment such an augmented, mixed, or virtual reality experience by providing a physical sensation responsive to user interaction with virtual imagery. Actuation of combined haptic actuators 102 may be used to generate related sensations of touch, texture, impact, etc.

Figure 2:
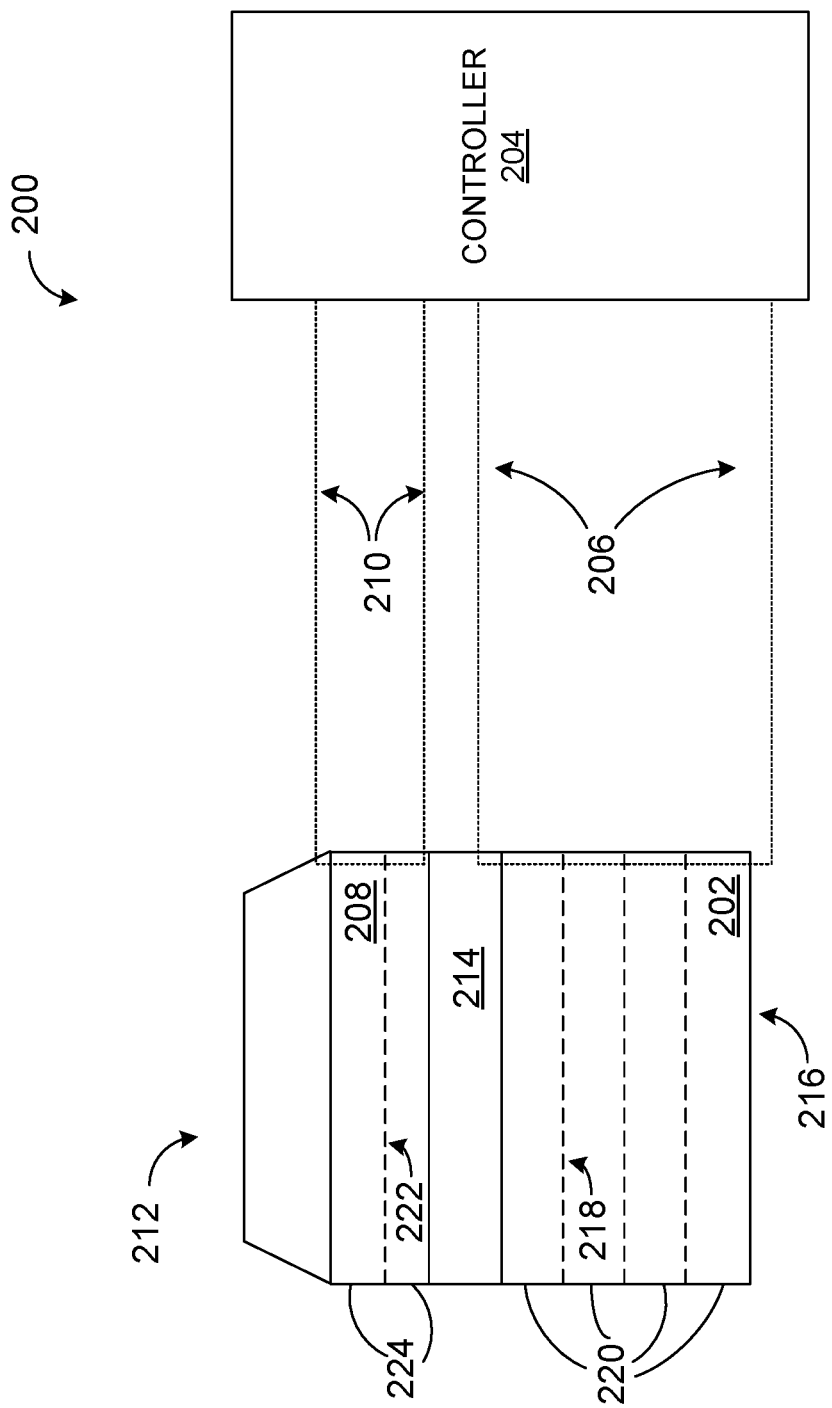
FIG. 2 schematically shows an example combined haptic actuator.

FIG. 2 schematically shows an example haptic feedback system 200. Haptic feedback system 200 includes a first haptic actuator 202 coupled to a controller 204 via a first set 206 of two or more electrodes. Haptic feedback system 200 further includes a second haptic actuator 208 coupled to controller 204 via a second set 210 of two or more electrodes.

In this example, first haptic actuator 202 is physically coupled to second haptic actuator 208 in a stack 212 arrangement. First haptic actuator 202 and second haptic actuator 208 are coupled together via adhesive layer 214, but may be coupled in any other suitable manner.

In some examples, the second haptic actuator 208 may comprise a more rigid material than first haptic actuator 202. For example, first haptic actuator 202 may be a piezoelectric polymer, such as PVDF, while second haptic actuator 208 may be a piezoelectric ceramic material, such as PZT. As such, first haptic actuator 202 may be positioned on a user-adjacent side 216 of stack 212. Second haptic actuator 208 may be considered to be positioned on a user-distal side of stack 212, opposite user adjacent side 216.

First haptic actuator 202 may be fabricated from any suitable soft polymer, such as PVDF, acrylates, silicones, etc. In contrast, second haptic actuator 208 may be fabricated from any suitable piezoelectric ceramic material, such as PZT (lead zirconium titanite), KNN (potassium sodium niobite), BNT (barium neodymium titanite), BNN (barium sodium niobite), BST (barium strontium titanite), BT (barium titanite), BZT (barium zirconium titanite), etc.

In such an example, the elastic modulus for first haptic actuator 202 may be significantly different than for second haptic actuator 208. As such, they may experience significant displacement relative to one another upon actuation. Accordingly, adhesive layer 214 may be selected from a material or materials that mitigate relative displacement of the two actuators due to elastic modulus mismatch. For example, adhesive layer 214 may comprise a soft silicone adhesive, a thick pressure sensitive adhesive (PSA) film, or any other suitable high compliance adhesive. In this way, adhesive layer 214 may stretch differently on both faces without breaking down, thus helping to prevent delamination between the two actuators. In this manner, adhesive layer 214 may maintain the physical alignment between the two actuators so that the haptic output spatial relationship between the two actuators does not shift.

Each of first haptic actuator 202 and second haptic actuator 208 may comprise a multi-layer structure. For example, first haptic actuator 202 is shown with three conductors 218 sandwiched in between four layers of piezoelectric polymer material 220. Second haptic actuator 208 is shown with one conductor 222 sandwiched in between two adjacent layers of piezoelectric ceramic material 224. However, the number of conductor layers and piezoelectric layers depicted is shown merely for example, and more or fewer layers may be used. Conductors 218 and 222 may be fabricated from any suitable material(s), such as copper, silver, carbon, etc. As one example, for first haptic actuator 202, flexible silver electrodes may be screen printed between layers of PVDF. Additionally or alternatively, sputtering or other deposition methods may be used to deposit conductive electrodes onto piezoelectric polymer films. For second haptic actuator 208, each conductor 222 may fill the entire space between the piezoelectric ceramic layers 224. For example, copper conductors may be formed via electroless plating between layers 224.

First set of electrodes 206 and second set of electrodes 210 are each shown as having a pair of electrodes. However, more electrodes may be used for each set, or the sets may have one or more shared electrodes. As shown, in some examples, each set of electrodes is configured to bi-directionally carry information (e.g., to and from controller 204). Controller 204 is configured to provide a first drive signal to first haptic actuator 202 via first set of electrodes 206, and to provide a second drive signal, different from the first drive signal, to second haptic actuator 208 via second set of electrodes 210. Controller 204 is further configured to receive a first feedback signal from first haptic actuator 202 via first set of electrodes 206, and to receive a second feedback signal, from second haptic actuator 208 via second set of electrodes 210.

The feedback signals may be derived from deformation at the haptic actuators. Based on piezoelectric physics, when force is applied to each haptic actuator structure by touching, tapping, etc., charge will be generated and transported to the coupled electrode set. By sensing the amount of charges flowing across the two electrodes, the value of force may be accurately detected. Based on the deformation differences in the materials, second haptic actuator may give highly attenuated feedback, while the first haptic actuator may give lower attenuated, longer wavelength feedback.

As such, the controller may be used to both receive and output voltages. For example, each electrode may trace to a universal i/o pin at controller 204 via an A/D converter. Controller 204 may read a voltage at that pin (feedback signal) and/or provide a drive signal via the pin.

The first drive signal and second drive signal may comprise different voltages, frequencies, and/or waveform shapes such that different information is delivered to the first and second haptic actuators, thus creating different types of haptic output. As an example, first haptic actuator 202 may be used to generate continuously modulated vibration. In such an example, the first drive signal may comprise a generally sinusoidal waveform with a frequency ranging from 100 to 200 Hz, although other waveforms and frequencies may be used. The relatively larger bending deformation of the second haptic actuator 208 may be used to generate a "burst" experience, such as a kick, sudden knocking, etc. In such an example the second drive signal may comprise a pulse waveform within a frequency range of 200 to 300 Hz. Selective triggers determined at controller 204 may thus give either subtle or very strong feedback. The amplitudes of the first and second drive signals may vary based on the materials included in the first and second haptic actuators. The specific frequencies used may be based on the natural resonance frequencies of the respective haptic actuators.

Haptic feedback system 200 may thus help to provide a spectrum of possible feedback at a position in a wearable device (e.g., based on a broad range of deformation), and by actuating a broader palate of features to represent a texture or virtual contact. The feedback signals may be used in part to generate control signals for other devices within the wearable device (e.g., electrostatic clutches). Additionally, it is noted that PZT actuators may be utilized over a range of 6-100V, depending on the number of PZT layers. Likewise, PVDF actuators may be utilized within a range of 150-300V, and thereby may provide relatively lower operating voltages than other piezoelectric materials.

Figure 3:
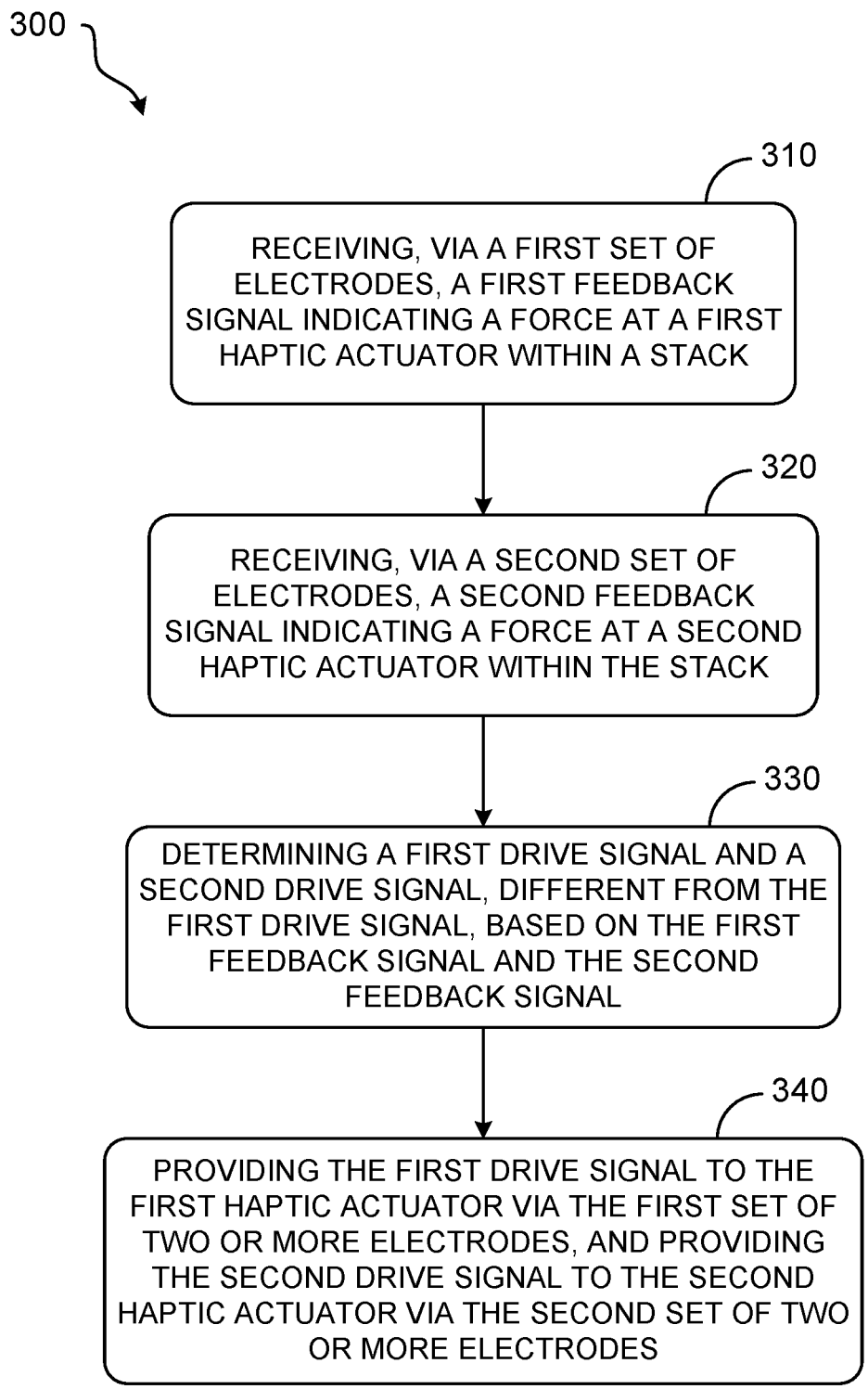
FIG. 3 shows an example method for operating a haptic feedback system including a combined haptic actuator.

The haptic feedback system described with regard to FIG. 2 may enable one or more control methods. As an example, FIG. 3 depicts a flow chart for a method 300 of operating a haptic feedback system. Method 300 may be executed by one or more controllers, such as controller 204, and may be executed in the context of a wearable device, such as wearable device 100.

At 310, method 300 includes receiving, via a first set of electrodes, a first feedback signal indicating a force at a first haptic actuator within a stack. For example, as a force is applied on first haptic actuator 202, electrical charges are generated across first set of electrodes 206. The electrical signal is sent to controller 204.

At 320, method 300 includes receiving, via a second set of electrodes, a second feedback signal indicating a force at a second haptic actuator within the stack. For example, as a force is applied on second haptic actuator 208, electrical charges are generated across second set of electrodes 210. The electrical signal is sent to controller 204.

At 330, method 300 includes determining a first drive signal and a second drive signal, different from the first drive signal, based on the first feedback signal and the second feedback signal. For example, controller 204 may determine a first force based on the first feedback signal and a second force based on the second feedback signal. Based at least in part on the first and second determined forces, the controller may generate first and second drive signals to be applied to the first and second haptic actuators within the stack. The frequency, force, and waveform pattern of the first and second drive signals may be different and may be generated independently. However, in some examples, one or more of the first and second drive signals may be generated based on one or both the first and second feedback signals.

At 340, method 300 includes providing the first drive signal to the first haptic actuator via the first set of two or more electrodes, and providing the second drive signal to the second haptic actuator via the second set of two or more electrodes. The first and second drive signals may serve to actuate (e.g., deform) the first and second haptic actuators, respectively, thereby generating haptic output to a force applying object contacting the stack. For example, forces may be determined at a knuckle position in a wearable device with a glove form, and a response provided at the same location based on the determined forces. The first and second drive signals may be updated continuously, periodically, or based on a threshold change in perceived force.

In another example, a combined haptic actuator maybe implemented for real-world scenarios wherein feedback and output control are desired at the same point of contact. For example, combined haptic actuators may be embedded in furniture or auto interiors. As an example, a massage chair may have a plurality of combined haptic actuators embedded below an upholstered surface. The position of the user may be detected via the force applied to the haptic actuators. The actuation signal applied to those actuators may then be adjusted based on the position of the user.

As described above, soft robotic applications may also benefit from the implementation of combined haptic actuators. Human fingers have hundreds of nerve endings just below the surface of the skin. Some are used for detecting sensation, others for applying force via muscle contractions. Combining both functions into one device may provide for similar capabilities in a soft robotic device, thereby allowing for feedback generation and suitable responsive force application in real time.

Figure 4:
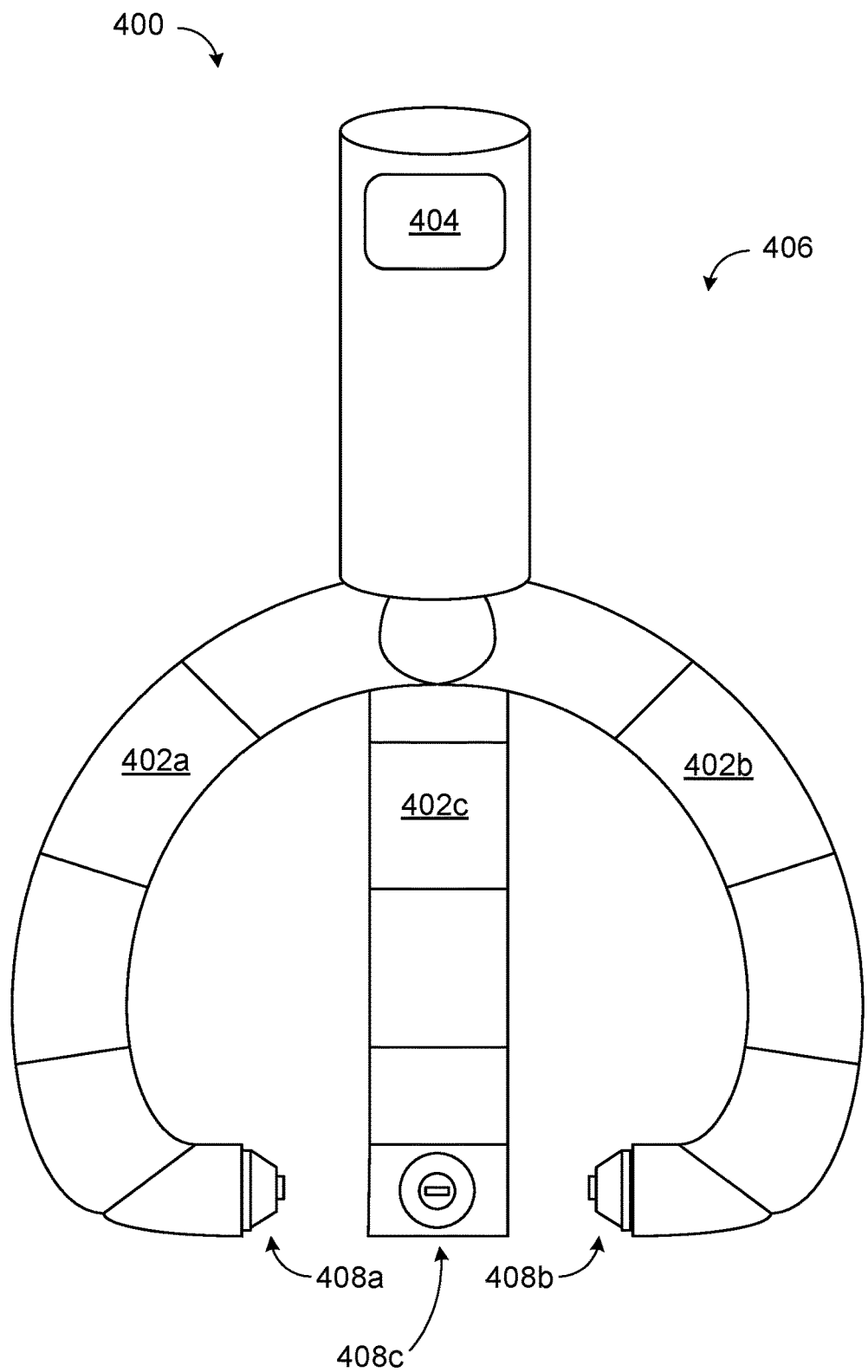
FIG. 4 schematically shows an example soft robotics device.

FIG. 4 schematically shows an example soft robotics device 400. Soft robotics device is shown in the form of a claw that may be used for touching, grasping, or otherwise manipulating physical objects. Soft robotics device 400 is depicted as having three grasping claws, 402a, 402b, and 402c. Each grasping claw may be independently moved, extended, and brought together via a plurality of joints. This movement may be controlled by signals provided by controller 404. Controller 404 may be a part of haptic feedback system 406.

Movement of grasping claws 402a, 402b, and 402c may provide a basis for gross adjustments to the conformation of soft robotics device 400 in manipulating an object. Fine adjustments may be triggered by haptic feedback system 406, which also includes haptic actuators 408a, 408b, and 408c. Haptic actuators 408a, 408b, and 408c may serve as robotic fingertips which can operate to both sense and apply force on an object. Although depicted as having one haptic actuator per grasping claw, other examples may include two or more haptic actuators per grasping claw.

Figure 5A:
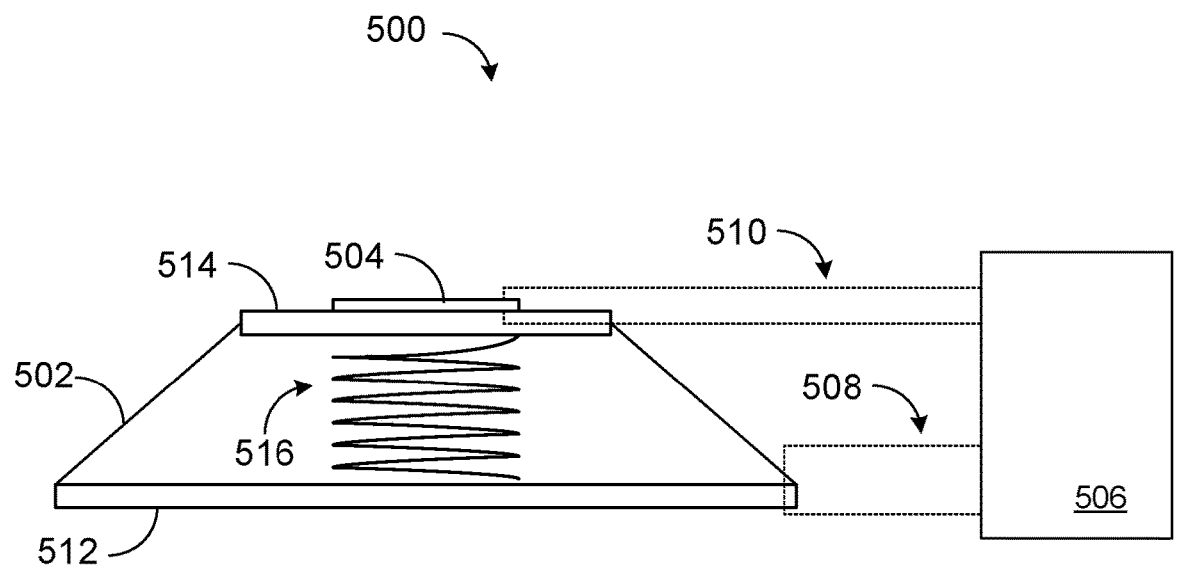
FIGS. 5A and 5B schematically show an additional example haptic feedback system.
Figure 5B:
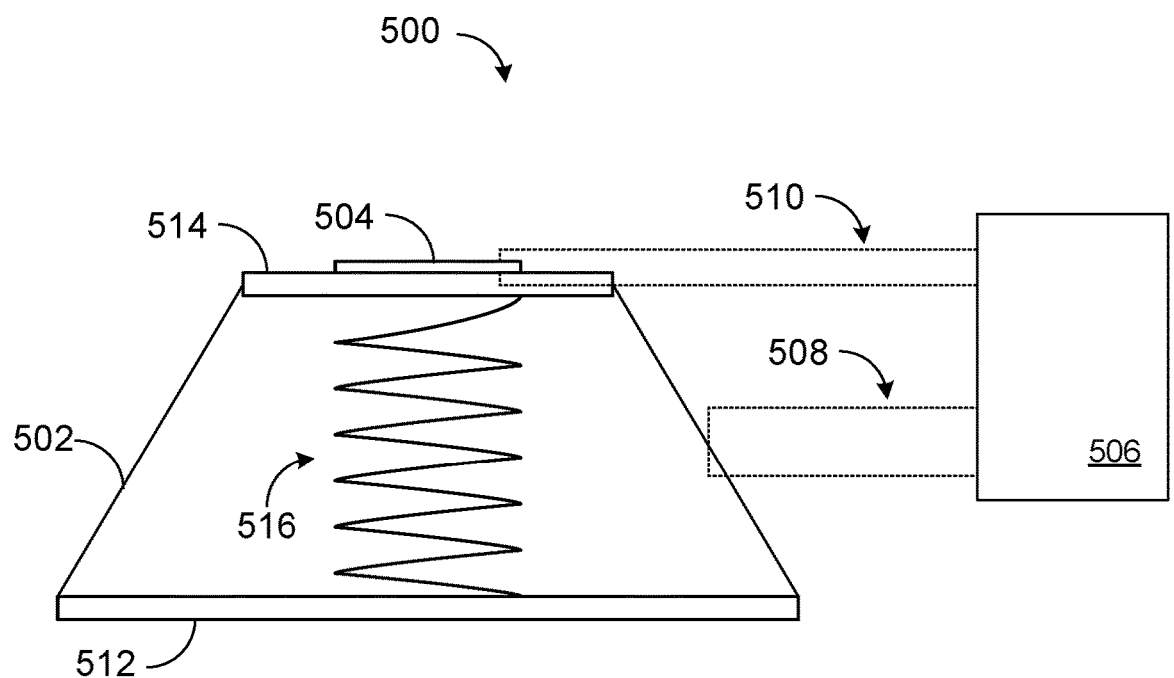

FIGS. 5A and 5B schematically depict another example haptic feedback system 500. Haptic feedback system includes a first haptic actuator 502 and a second haptic actuator 504 that is coupled to first haptic actuator 502. In this example, first haptic actuator may be a piezoelectric polymer (e.g., PVDF, silicon film), while second haptic actuator 504 may be a piezoelectric ceramic (e.g., PZT). First haptic actuator 502 is coupled to controller 506 via a first set of two or more electrodes 508, while second haptic actuator 504 is coupled to controller 506 via a second set of two or more electrodes 510.

In this example, a rigid substrate 512 is coupled to an outer region of first haptic actuator 502. Rigid substrate 512 may be a thin disc manufactured from metal, ceramic, a rigid polymer (e.g., ABS), or other suitable material. A rigid cap 514 is coupled to an inner region of first haptic actuator 502. Rigid cap 514 may be manufactured from the same, or a similar material as rigid substrate 512. Second haptic actuator 504 is shown coupled to first haptic actuator 502 via rigid cap 514. A compressible member 516 is depicted as being coupled between rigid substrate 512 and rigid cap 514. Although depicted as a spring, compressible member 516 may be formed from any other suitable material, such as a compressible foam or other resilient, compressible material.

Control signals from controller 506 may be used to actuate first haptic actuator 502. As shown in FIG. 5B, actuation of first haptic actuator 502 will cause the piezoelectric polymer to soften, and thus to elongate. Accordingly, compressible member 516 will expand, driving rigid cap 514 away from rigid substrate 512. Depending on the spring constant of compressible member 516, a high or low force may be generated. Providing a rigid substrate 512 may allow this force to be provided in one direction (away from the substrate).

As such, haptic feedback system 500 may provide for a control loop where force is sensed and then adjusted. Controller 506 may be configured to receive a first deformation signal from second haptic actuator 504 via the second set of two or more electrodes 510, and to provide a first drive signal to first haptic actuator 502 via first set of two or more electrodes 508. The first drive signal may be based at least in part on the first deformation signal. In this way, second haptic actuator 504 may sense a pressure, and a drive signal sent to first haptic actuator 502 may modulate this pressure, by either elongating, retracting, or maintaining the position of compressible member 516 via actuation of first haptic actuator 502.

In soft robotics systems, such as system 400, where multiple combined actuators are applied, the deformation signals from one or more additional actuators may be used to generate respective drive signals. In some examples, a second drive signal may be applied to second haptic actuator 504. This second drive signal may be based on one or more deformation signals. In some examples, first haptic actuator 504 may also provide a deformation signal to controller 506, though this signal may be much smaller (e.g. orders of magnitude) than those generated by second haptic actuator 504. In non-wearable systems, higher input voltages may be used to drive first haptic actuator 502. Thus a more robust material such as silicon film, which may utilize an input voltage of ~900-2000V may be preferred over PVDF.

Figure 6:
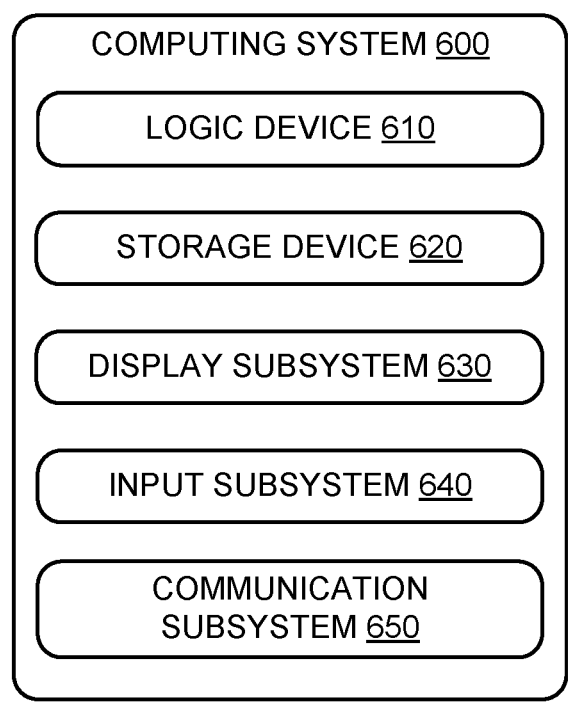
FIG. 6 schematically shows a block diagram of an example computing system.

FIG. 6 schematically shows a non-limiting embodiment of a computing system 600 that can enact one or more of the methods and processes described above. Computing system 600 is shown in simplified form. Computing system 600 may take the form of one or more personal computers, server computers, tablet computers, home-entertainment computers, network computing devices, gaming devices, mobile computing devices, mobile communication devices (e.g., smart phone), and/or other computing devices.

Computing system 600 includes a logic machine 610 and a storage machine 620. Computing system 600 may optionally include a display subsystem 630, input subsystem 640, communication subsystem 650, and/or other components not shown in FIG. 6.

Logic machine 610 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 620 includes one or more physical devices configured to hold instructions executable by the logic machine to implement the methods and processes described herein. When such methods and processes are implemented, the state of storage machine 620 may be transformed—e.g., to hold different data.

Storage machine 620 may include removable and/or built-in devices. Storage machine 620 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 620 may include volatile, nonvolatile, dynamic, static, read/write, read-only, random-access, sequential-access, location-addressable, file-addressable, and/or content-addressable devices.

It will be appreciated that storage machine 620 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 610 and storage machine 620 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 630 may be used to present a visual representation of data held by storage machine 620. This visual representation may take the form of a graphical user interface (GUI). As the herein described methods and processes change the data held by the storage machine, and thus transform the state of the storage machine, the state of display subsystem 630 may likewise be transformed to visually represent changes in the underlying data. Display subsystem 630 may include one or more display devices utilizing virtually any type of technology. Such display devices may be combined with logic machine 610 and/or storage machine 620 in a shared enclosure, or such display devices may be peripheral display devices.

When included, input subsystem 640 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 650 may be configured to communicatively couple computing system 600 with one or more other computing devices. Communication subsystem 650 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 600 to send and/or receive messages to and/or from other devices via a network such as the Internet.

In another example, an electronic device comprises a haptic feedback system, including a first haptic actuator coupled to a controller via a first set of two or more electrodes; and a second haptic actuator coupled to the first haptic actuator, and further coupled to the controller via a second set of two or more electrodes, and wherein the controller is configured to provide a first drive signal to the first haptic actuator via the first set of two or more electrodes, and to provide a second drive signal, different from the first drive signal, to the second haptic actuator via the second set of two or more electrodes. In such an example, or any other example, the first haptic actuator and second haptic actuator may additionally or alternatively be physically coupled together within a stack. In any of the preceding examples, or any other example, the first haptic actuator and second haptic actuator may additionally or alternatively be coupled together via an adhesive layer. In any of the preceding examples, or any other example, the adhesive layer may additionally or alternatively be configured to mitigate displacement due to elastic modulus mismatch between the first haptic actuator and the second haptic actuator. In any of the preceding examples, or any other example, the adhesive layer may additionally or alternatively include one of a soft silicone adhesive and a pressure sensitive adhesive film. In any of the preceding examples, or any other example, the second haptic actuator may additionally or alternatively comprise a more rigid material than the first haptic actuator. In any of the preceding examples, or any other example, the electronic device may additionally or alternatively be a wearable device. In any of the preceding examples, or any other example the haptic feedback system may additionally or alternatively be configured with the first haptic actuator on a user-adjacent side. In any of the preceding examples, or any other example, the second haptic actuator may additionally or alternatively comprise a piezoelectric ceramic material. In any of the preceding examples, or any other example, the first haptic actuator may additionally or alternatively comprise a piezoelectric polymer. In any of the preceding examples, or any other example, the first haptic actuator may additionally or alternatively comprise two or more layers of piezoelectric polymer, and may additionally or alternatively comprise a conductor sandwiched between each pair of adjacent layers of piezoelectric polymer. In any of the preceding examples, or any other example the controller may additionally or alternatively be further configured to receive a first feedback signal from the first haptic actuator via first set of two or more electrodes, and to receive a second feedback signal from the second haptic actuator via the second set of two or more electrodes. In any of the preceding examples, or any other example, the first and second drive signals may additionally or alternatively be based at least in part on one or more of the first and second feedback signals.

In another example, a soft robotics system comprises a haptic feedback system, including a first haptic actuator coupled to a controller via a first set of two or more electrodes; and a second haptic actuator coupled to the first haptic actuator, and further coupled to the controller via a second set of two or more electrodes, and wherein the controller is configured to receive a first deformation signal from the second haptic actuator via the second set of two or more electrodes, and to provide a first drive signal to the first haptic actuator via the first set of two or more electrodes, the first drive signal based at least in part on the first deformation signal. In such an example, or any other example, the soft robotics system may additionally or alternatively comprise a rigid substrate coupled to an outer region of the first haptic actuator; a rigid cap coupled to an inner region of the first haptic actuator; and a compressible member coupled between the rigid substrate and the rigid cap, and wherein the second haptic actuator is coupled to the first haptic actuator via the rigid cap. In any of the preceding examples, or any other example, actuation of the first haptic actuator may additionally or alternatively cause elongation of the compressible member. In any of the preceding examples, or any other example, the first haptic actuator may additionally or alternatively comprise a polymer film and wherein the second haptic actuator may additionally or alternatively comprise a piezoelectric ceramic material. In any of the preceding examples, or any other example, the first haptic actuator may additionally or alternatively be located on an outer surface of a grasping claw.

In yet another example, a method for operating a haptic feedback system comprises providing a first drive signal to a first haptic actuator via a first set of two or more electrodes; and providing a second drive signal, different from the first drive signal, to a second haptic actuator via a second set of two or more electrodes, the second haptic actuator physically coupled to the first haptic actuator within a stack. In such an example, or any other example, the method may additionally or alternatively comprise receiving, via the first set of electrodes, a first feedback signal indicating a force at the first haptic actuator; receiving, via the second set of electrodes, a second feedback signal indicating a force at the second haptic actuator, and wherein the first drive signal and the second drive signal are determined based on the first feedback signal and the second feedback signal.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:
    a haptic feedback system, comprising
        a first haptic actuator comprising a piezoelectric polymer;
        a second haptic actuator comprising a piezoelectric ceramic;
        a silicone adhesive layer between the first haptic actuator and the second haptic actuator, the silicone adhesive layer configured to mitigate displacement due to elastic modulus mismatch between the first haptic actuator and the second haptic actuator; and
        a controller connected to the first haptic actuator by a first electrode and to the second haptic actuator by a second electrode, the controller comprising instructions executable to provide a first drive signal to the first haptic actuator via the first electrode, and to provide a second drive signal, different from the first drive signal, to the second haptic actuator via the second electrode.

2. The electronic device of claim 1, wherein the first haptic actuator, silicone adhesive layer, and second haptic actuator are arranged as a stack.

3. The electronic device of claim 1, wherein the silicone adhesive layer includes one of a soft adhesive and a pressure sensitive adhesive film.

4. The electronic device of claim 1, wherein the electronic device comprises a wearable device.

5. The electronic device of claim 4, wherein the haptic feedback system is configured with the first haptic actuator on a side configured to be user-adjacent.

6. The electronic device of claim 1, wherein the first haptic actuator comprises two or more layers of piezoelectric polymer, and further comprises a conductor located between each pair of adjacent layers of piezoelectric polymer.

7. The electronic device of claim 1, wherein the second haptic actuator comprises two or more layers of piezoelectric ceramic, and further comprises a conductor located between each pair of adjacent layers of piezoelectric ceramic.

8. The electronic device of claim 1, wherein the first electrode is within a first set of two or more electrodes, wherein the second electrode is within a second set of two or more electrodes, and wherein the controller is further configured to receive a first feedback signal from the first haptic actuator via the first set of two or more electrodes, and to receive a second feedback signal from the second haptic actuator via the second set of two or more electrodes.

9. The electronic device of claim 8, wherein the first and second drive signals are based at least in part on one or more of the first feedback signal and second feedback signal.

10. A method for operating a haptic feedback system, comprising:
providing a first drive signal to a first haptic actuator via a first electrode, thereby causing the first haptic actuator to vibrate at a first frequency of 10 Hz or higher; and
providing a second drive signal to a second haptic actuator via a second electrode, thereby causing the second haptic actuator to vibrate at a second frequency greater than the first frequency, the first haptic actuator and the second haptic actuator being arranged within a stack including a silicone adhesive layer between the first haptic actuator and the second haptic actuator, the silicone adhesive layer configured to mitigate displacement due to elastic modulus mismatch between the first haptic actuator and the second haptic actuator.

11. The method of claim 10, wherein the first electrode is within a first set of electrodes and the second electrode is within a second set of electrodes, and further comprising:
receiving, via the first set of electrodes, a first feedback signal indicating a force at the first haptic actuator;
receiving, via the second set of electrodes, a second feedback signal indicating a force at the second haptic actuator, and wherein
the first drive signal and the second drive signal are determined based on the first feedback signal and the second feedback signal.

12. The method of claim 10, wherein providing the first drive signal comprises providing a sinusoidal waveform, and wherein providing the second drive signal comprises providing a pulse waveform.

13. An electronic device, comprising:
a haptic feedback system, including
a first haptic actuator;
a second haptic actuator;
a silicone adhesive layer between the first haptic actuator and the second haptic actuator, the silicone adhesive layer comprising a high compliance material configured to maintain an alignment between the first haptic actuator and the second haptic actuator; and
a controller connected to the first haptic actuator by a first electrode and further connected to the second haptic actuator by a second electrode, the controller comprising instructions executable to
provide, via the first electrode, a first drive signal to the first haptic actuator to drive the first haptic actuator at a first frequency of 10 Hz or greater, and
provide, via the second electrode, a second drive signal to the second haptic actuator to drive the second haptic actuator at a second frequency greater than the first frequency.

14. The electronic device of claim 13, wherein the first haptic actuator comprises a piezoelectric polymer.

15. The electronic device of claim 14, wherein the second haptic actuator comprises a piezoelectric ceramic.

16. The electronic device of claim 15, wherein the first haptic actuator and the second haptic actuator are arranged within a stack.

17. The electronic device of claim 13, wherein the first haptic actuator comprises two or more layers of piezoelectric polymer, and further comprises a first conductor located between each pair of adjacent layers of piezoelectric polymer; and
wherein the second haptic actuator comprises two or more layers of piezoelectric ceramic, and further comprises a second conductor located between each pair of adjacent layers of piezoelectric ceramic.

* * * * *